(12) United States Patent
Lee (10) Patent No.: US 6,781,374 B1
(45) Date of Patent: Aug. 24, 2004

(54) SYSTEMS AND METHODS FOR SIMULTANEOUS ACQUISITION OF SPATIAL HARMONICS

(75) Inventor: Ray Fli Lee, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/446,034

(22) Filed: May 27, 2003

(51) Int. Cl.[7] ............................................... G01V 3/00
(52) U.S. Cl. ............................ 324/309; 324/307
(58) Field of Search ............................ 324/309, 307, 324/306, 312, 314, 300

(56) References Cited

U.S. PATENT DOCUMENTS

| | | | |
|---|---|---|---|
| 5,910,728 A | | 6/1999 | Sodickson |
| 6,097,186 A | * | 8/2000 | Nabetani ..................... 324/319 |
| 6,289,232 B1 | | 9/2001 | Jakob et al. |
| 6,377,045 B1 | | 4/2002 | Van Den Brink et al. |
| 6,400,151 B1 | | 6/2002 | Haase et al. |
| 6,476,606 B2 | | 11/2002 | Lee |
| 6,545,472 B2 | | 4/2003 | Prussman et al. |
| 6,680,610 B1 | * | 1/2004 | Kyriakos et al. ............ 324/307 |
| 6,714,010 B2 | * | 3/2004 | Madore ....................... 324/307 |
| 6,717,406 B2 | * | 4/2004 | Sodickson ................... 324/307 |

* cited by examiner

Primary Examiner—Louis Arana
(74) Attorney, Agent, or Firm—Jean K. Testa; Patrick K. Patnode (57) ABSTRACT

A magnetic resonance imaging (MRI) method is described. The method includes simultaneously acquiring partial radial backprojection signals from a cylindrical array of m detectors surrounding an object, generating, in a k-space, additional backprojection signals with decimated b-fold backprojection steps. The generating includes producing 2-dimensional (2D) spatial harmonics to replace the decimated b-fold backprojection steps. The producing includes assuming that a sum of weighted sensitivity profiles of at least one of the detectors is a function of an angle between a vector k and an axis $k_x$ of the k-space and a function of a radius of a cylindrical surface formed by the array of detectors. The angle is an angle along which reconstruction of an image of the object is performed.

20 Claims, 4 Drawing Sheets

SYSTEMS AND METHODS FOR SIMULTANEOUS ACQUISITION OF SPATIAL HARMONICS

BACKGROUND OF THE INVENTION

This invention relates generally to magnetic resonance imaging systems and methods and more particularly to radially simultaneous acquisition of spatial harmonics (radial SMASH) systems and methods.

Magnetic resonance imaging (MRI) is a technique that is capable of providing three-dimensional imaging of an object. An MRI system includes a main magnet that provides a magnetic field, gradient coils and radio frequency (RF) coils, which are used for spatial encoding, exciting and detecting nuclei of the object for imaging. The object to be imaged is positioned in a homogeneous field region located in an air space between poles of the magnet. The gradient coils and the RF coils are typically located external to the object to be imaged and inside the geometry of the main magnet.

One technique for decreasing imaging time has concentrated on increasing speed of sequential scanning of a k-space in which the object is located and thus acquisition of MR data by reducing intervals between scanned lines in a slice of the object. Two recent techniques, SMASH technique in a time domain or the k-space and Sensitivity Encoded (SENSE) technique in a frequency domain, changes such sequential data acquisition into a partially parallel process by using an array of detectors, thereby reducing scan time as compared to the sequential data acquisition technique. In the SMASH and SENSE techniques, it is recognized that the data sampled below the Nyquist sampling rate can be recovered if sensitivity profiles of the detectors of the array can provide enough spatial information to either interpolate the data in the time domain or unwrap the data in the frequency domain. The SMASH technique uses a numerical fitting routine to interpolate a decimated number of phase encoding steps and thus, achieve reductions in scan time. There is described in U.S. Pat. No. 5,910,728. However, in the SMASH and SENSE techniques, a maximum aliasing fold that can be unwrapped is limited to the number of detectors in the array.

BRIEF DESCRIPTION OF THE INVENTION

In one aspect, a magnetic resonance imaging (MRI) method is described. The method includes simultaneously acquiring partial radial backprojection signals from a cylindrical array of m detectors surrounding an object, generating, in a k-space, additional backprojection signals with decimated b-fold backprojection steps. The generating includes producing 2-dimensional (2D) spatial harmonics to replace the decimated b-fold backprojection steps. The producing includes assuming that a sum of weighted sensitivity profiles of at least one of the detectors is a function of an angle between a vector k and an axis $k_x$ of the k-space and a function of a radius of a cylindrical surface formed by the array of detectors. The angle is an angle along which reconstruction of an image of the object is performed.

In another aspect, a system is described. The system includes a signal detection device having a cylindrical array of m detectors surrounding an object and configured to simultaneously acquire partial radial backprojection signals from the cylindrical array, and a controller electrically connected to the signal detection device. The controller is configured to generate, in a k-space, additional backprojection signals with decimated b-fold backprojection steps. To generate the additional backprojection signals the controller is configured to produce 2-dimensional (2D) spatial harmonics to replace the decimated b-fold backprojection steps. To produce the 2D spatial harmonics, the controller is configured to retrieve from a memory a sum of weighted sensitivity profiles of at least one of the detectors that is a function of an angle between a vector k and an axis $k_x$ of the k-space and a function of a radius of a cylindrical surface formed by the array of detectors. The angle is an angle along which reconstruction of an image of the object is performed.

In yet another aspect, a magnetic resonance imaging (MRI) system is described. The MRI system includes a magnetic resonance (MR) signal detection device having an array of m detectors surrounding an object and configured to simultaneously acquire partial radial backprojection signals from the cylindrical array, and a controller electrically connected to the MR signal detection device. The controller is configured to generate, in a k-space, additional backprojection signals with decimated b-fold backprojection steps. To generate the additional backprojection signals, the controller is configured to produce 2-dimensional (2D) spatial harmonics to replace the decimated b-fold backprojection steps. To produce the 2D spatial harmonics, the controller is configured to retrieve from a memory a sum of weighted sensitivity profiles of at least one of the detectors that is a function of an angle between a vector k and an axis $k_x$ of the k-space and a function of a radius of a cylindrical surface formed by the array of detectors. The angle is an angle along which reconstruction of an image of the object is performed.

DETAILED DESCRIPTION OF THE INVENTION

Figure 1:
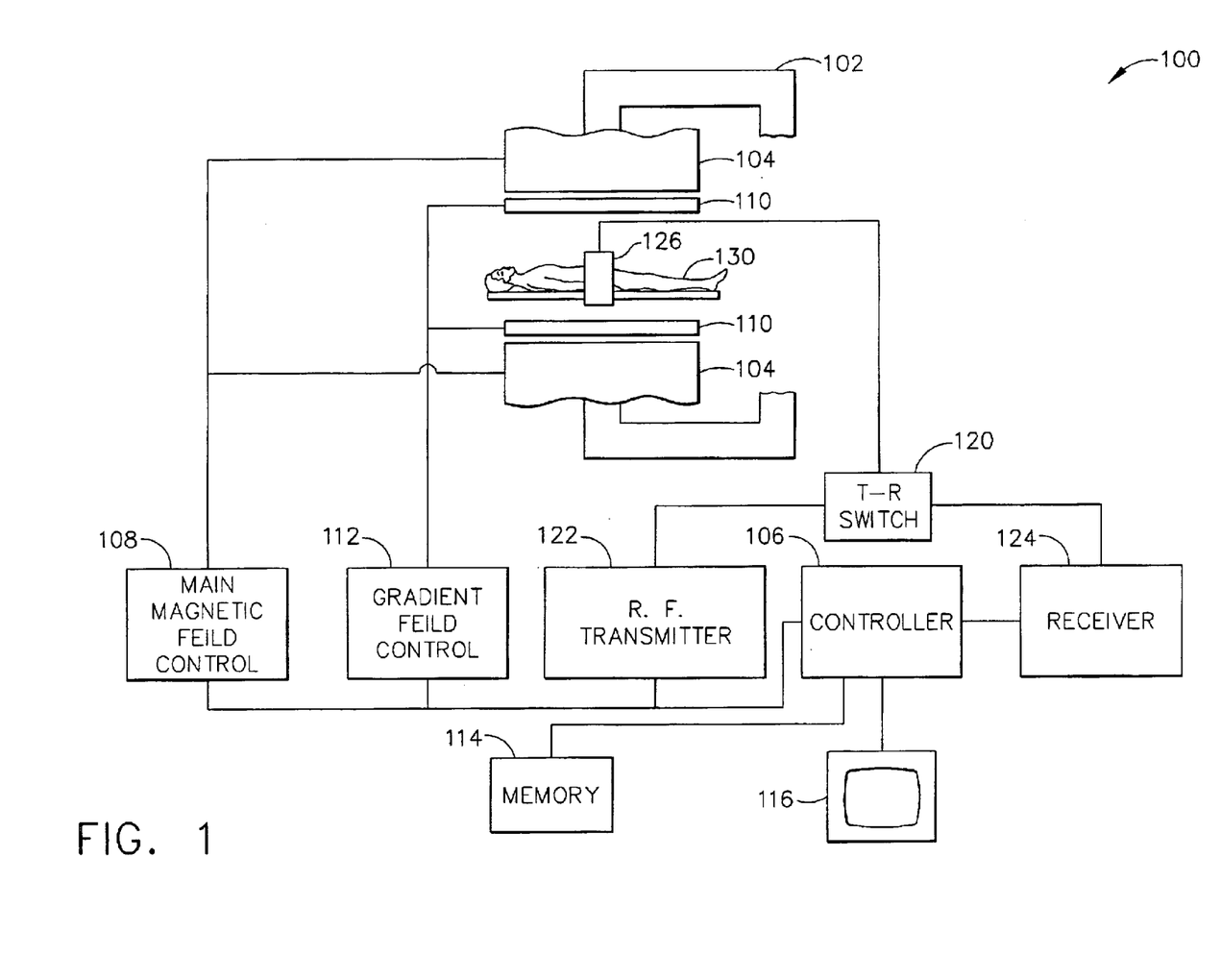
FIG. 1 is a block diagram of an embodiment of a magnetic resonance imaging (MRI) system in which systems and methods for radially simultaneous acquisition of spatial harmonics (SMASH), referred to herein as radial SMASH systems and methods, are implemented.

FIG. 1 a block diagram of an embodiment of a magnetic resonance imaging (MRI) system 100 in which systems and methods for radially simultaneous acquisition of spatial harmonics (SMASH), referred to herein as radial SMASH systems and methods, are implemented.

MRI system 100 includes an electromagnet 102, pole pieces 104, a controller 106, a main magnetic field control 108, a gradient coil sub-system 110, a gradient field control 112, a memory 114, a display device 116, a transmit-receive (T-R) switch 120, a radio frequency (RF) transmitter 122, a receiver 124, and a cylindrical array 126 of equally-spaced detectors. Although electromagnet 102 is a C-shaped magnet, other shapes of electromagnets can be used.

In use of MRI system 100, a body 130 of an object, such as a patient or a phantom, to be imaged is placed in a gap between pole pieces 104 on a suitable support (not shown). Electromagnet 102 produces a uniform and static main magnetic field $B_o$ across the gap. The strength of the electromagnetic field in the gap and hence in body 130, is controlled by controller 106 via a main magnetic field control 108, which controls a supply of energizing current to a coil (not shown) that energizes electromagnet 102.

The magnetic field $B_o$ generated by the main magnet 102 is applied to body 130 that lies along a z-axis of a Cartesian coordinate system. The uniform magnetic field $B_o$ being applied has the effect of aligning nuclear spins, a quantum mechanical property of nuclei within body 130, along the z-axis. In response to RF pulses being generated by RF transmitter 122, that are orientated within an XY plane perpendicular to the z-axis, the nuclei resonate at their Larmor frequencies.

Array 126 is selectably interconnected to one of RF transmitter 122 or receiver 124 by T-R switch 120. RF transmitter 122 and T-R switch 120 are under the control of controller 106 so that RF pulses are generated by RF transmitter 122 and selectively applied to body 130 for excitation of magnetic resonance in body 130. While these RE pulses are being applied to body 130, T-R switch 120 also is actuated so as to de-couple receiver 124 from array 126.

Gradient coil sub-system 110, having one or more gradient coils, is provided so a magnetic field gradient can be imposed on the magnetic field in the gap between poles pieces 104 in any one or more of three orthogonal directions x, y, and z along an x-axis, a y-axis and the z-axis respectively. Gradient coil sub-system 110 is energized by gradient field control 112 that also is under the control of controller 106. In an imaging sequence, the RF pulse centered about a desired Lamor frequency is applied to body 130 at the same time a magnetic field gradient $G_z$ is being applied along the z-axis by means of gradient control sub-system 110. This gradient field $G_z$ causes the nuclei in a slice with a limited width through body 130 along the XY plane, to have a resonant frequency and to be excited into resonance.

After excitation of the nuclei in the slice, magnetic field gradients $G_x$ and $G_y$ are applied along the x and y axes respectively. The magnetic field gradient $G_x$ along the x-axis causes the nuclei to precess at different frequencies depending on their position along the x-axis, that is, $G_x$ spatially encodes the precessing nuclei by frequency, referred to as frequency encoding. The y-axis gradient $G_y$ is incremented through a series of values and encodes along the y-axis a rate of change of phase of the processing nuclei as a function of gradient amplitude, a process referred to as phase encoding.

Following application of the RF pulses, T-R switch 120 is actuated to de-couple array 126 from RF transmitter 122 and to couple array 126 to receiver 124. Array 126 includes detectors that are arranged to simultaneously detect MR signals from body 130. Array 126 in this arrangement detects or senses the MR signals resulting from the excited nuclei in the body and passes the MR signals onto receiver 124. These detected MR signals are in turn passed onto controller 106. Controller 106 implements a radial SMASH method to process the MR signals and to produce signals representative of an image of body 130. These processed signals representative of the image are sent onto display device 116 to provide a visual display of the image.

Figure 2:
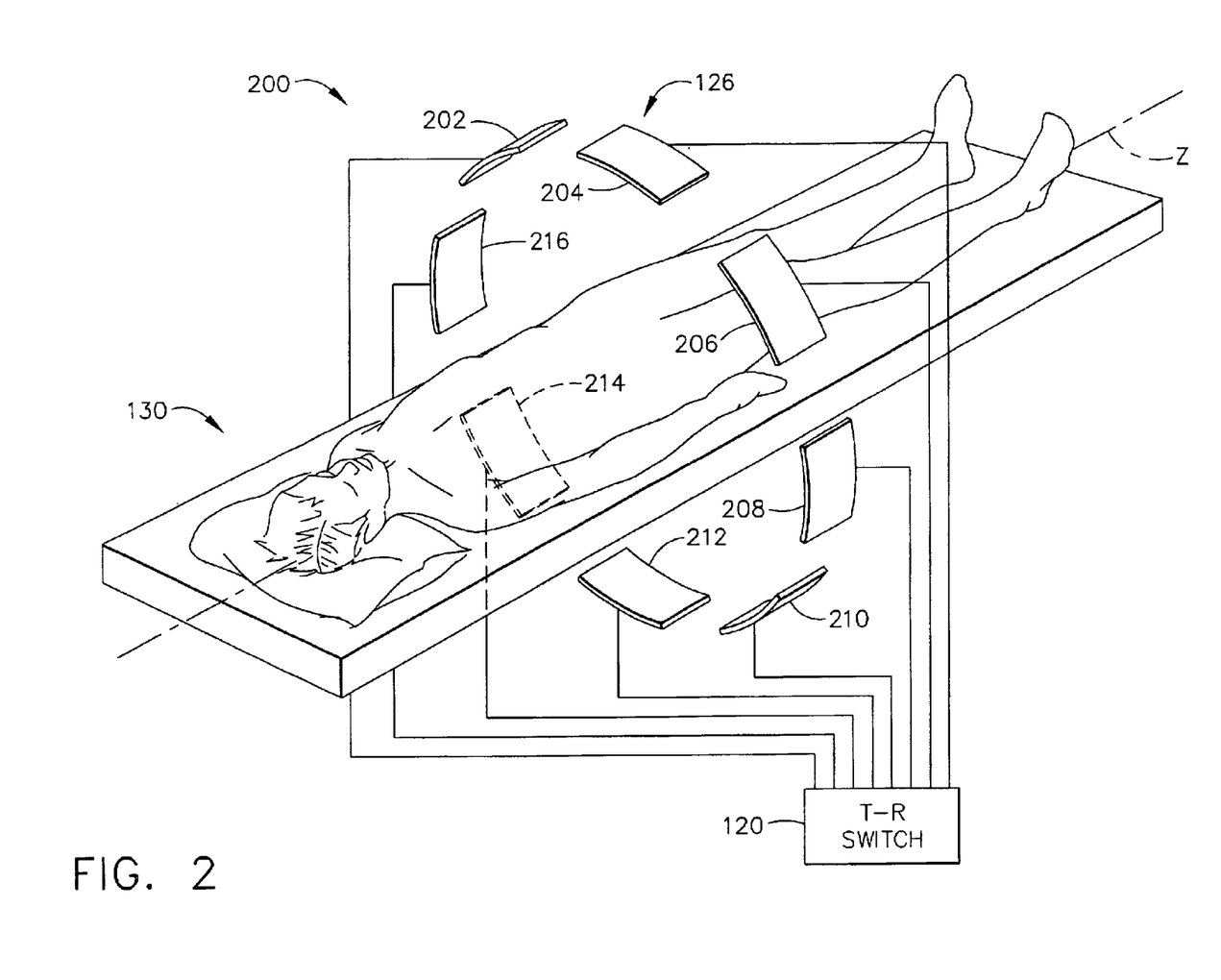
FIG. 2 shows an embodiment of a radial SMASH system.

FIG. 2 shows an embodiment of a radial SMASH system 200. Radial SMASH system 200 includes cylindrical array 126 of equally spaced detectors 202, 204, 206, 208, 210, 212, 214, and 216 that surround body 130. Ends of each detector 202, 204, 206, 208, 210, 212, 214, and 216 are shunted to a cylindrical shield (not shown) of capacitors. Each detector 202, 204, 206, 208, 210, 212, 214, and 216 is a coil having square, circular, or like geometries. In an embodiment, there is none or minimal inductive coupling between 202, 204, 206, 208, 210, 212, 214, and 216. If there is no inductive coupling between detectors 202, 204, 206, 208, 210, 212, 214, and 216, the detectors are de-coupled. Adjacent detectors, such as detectors 202 and 204, are de-coupled by non-overlapping the adjacent detectors and non-adjacent detectors, such as detectors 202 and 208, are de-coupled by a combination of matching circuits (not shown) and low impedance pre-amplifiers (not shown). In yet another embodiment, more than one array is used to detect partial gradient phase-encoded signals. For example, another cylindrical array (not shown) of detectors parallel to array 126 and surrounding body 130 is used to detect partial gradient phase-encoded signals. Each detector is electrically coupled to T-R switch 120.

During the spins of the nuclei within body 130, each detector 202, 204, 206, 208, 210, 212, 214, and 216 detects at the same time a partial radial backprojection signal, which is a type of an MR signal. The backprojection signal is radial since it is acquired by detectors 202, 204, 206, 208, 210, 212, 214, and 216 that are arranged in a radial fashion surrounding body 130. The backprojection signal is a partial backprojection signal since it is acquired by undersampling information located within spins of the nuclei of body 130. Partial radial back projection signals are produced as a result of a b-fold increase in phase encoding gradient $G_y$. The increase results in a b-fold reduction in a total number of backprojection steps. T-R switch 120 is actuated to de-couple RF transmitter 122 from array 126 and couple receiver 124 to array 126 so that receiver 124 receives a partial radial back projection signal from each detector 202, 204, 206, 208, 210, 212, 214, and 216. The partial radial back projection signals are provided to controller 106 that executes an embodiment of a radial SMASH method.

The radial SMASH method includes generating, in a k-space, additional backprojection signals with the decimated b-fold backprojection steps. The additional backprojection signals are generated by producing 2-dimensional (2D) spatial harmonics to replace the decimated b-fold backprojection steps. Each spatial harmonic provides an additional line in a k-space matrix. Once a full k-space matrix is constructed by interleaving additional lines, an image is reconstructed from the k-space matrix. The image is re-constructed by Fourier transform or non-Fourier transform methods. An example of Fourier transform methods includes performing inverse Fourier transform (IFT), such as fast Fourier transform (FFT), on the k-space matrix to construct the image. An example of non-Fourier transform methods includes performing backprojection on the k-space matrix to construct the image.

Figure 3:
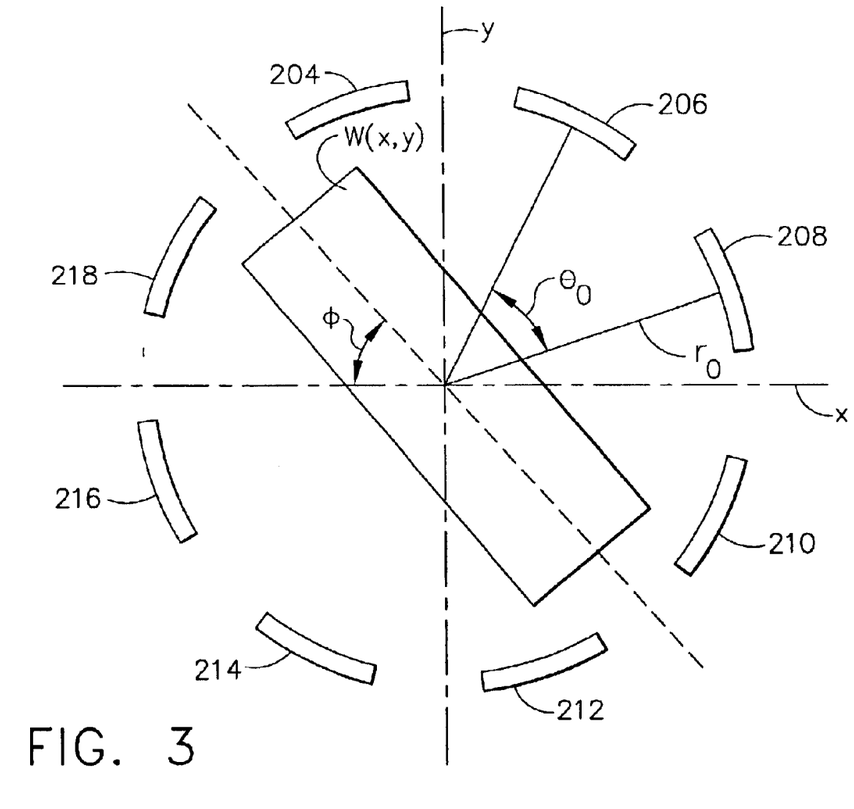
FIG. 3 shows a side-view of the radial SMASH system of FIG. 2.

FIG. 3 shows a side-view of the radial SMASH system of FIG. 2. The angle between any two adjacent detectors is $\theta_o$. For example, the angle between detectors 206 and 208 is $\theta_o$. $r_o$ is a radius of a field or view (FOV) or a cylindrical surface formed by array 126 of detectors 202, 204, 206, 208, 210, 212, 214, and 216, and $\phi$ is an angle between a vector k along which an image of body 130 is reconstructed and a $k_x$ axis of the k-space.

Each detector 202, 204, 206, 208, 210, 212, 214, and 216 senses a partial radial backprojection signal that is further provided to controller 106 by receiver 124 for processing and producing an image. The partial radial backprojection signal is defined by $$p(k,\varphi) = \sum_x \sum_y w(x,y)e^{jk(x\cos\varphi + y\sin\varphi)} = \sum_x \sum_y w(x,y)e^{j(k_x x + k_y y)} \quad \text{Equation (1)}$$

where x and y are coordinates in an image domain in which image of body 130 is produced, $k_x = k\cos\phi$ and $k_y = k\sin\phi$, $k_x$ being a k-space vector in the x-direction, $k_y$ being a k-space vector in the y-direction, and k being the vector along which backprojection of w(x,y) is performed. The spatial encoding term $\exp. j(k_x x + k_y y)$ includes frequency encoding by the gradient $G_x$ and phase encoding by the gradient $G_y$.

The spatial encoding term is viewed with another aspect. In the other aspect, it is assumed that the spatial encoding term includes weighted sensitivity profiles of m equally-spaced detectors of cylindrical array 126. The assumption is written in a form $$e^{jk(x\cos\varphi + y\sin\varphi)} = \sum_m C(m,k,\varphi)f(x - r_0\cos m\theta_0, y - r_0\sin m\theta_0) \quad \text{Equation (2)}$$

where $C(m,k,\phi)$ is a weighting coefficient of $m^{th}$ detector in array 126, and $f(x - r_o \cos m\theta_o, y - r_o \sin m\theta_o)$ is a sensitivity profile of the mth detector. The sensitivity profile is determined by using Biot-Savart law, Maxwell's equations, or experimental imaging methods.

A Fourier transform of Equation (2) yields $$C(m,k,\varphi) = \frac{e^{jkr_0\cos(\varphi - m\theta_0)}}{F(k\cos\varphi, k\sin\varphi)} \quad \text{Equation (3)}$$

where $F(k_x, k_y)$ is a Fourier transform of f(x,y). Equations (2) and (3) can be substituted into Equation (1) to obtain spatial harmonics to completely fill a k-space matrix. For instance, for m=2, which means that when two partial radial backprojection signals detected by two detectors, for example, detectors 202 and 208, are combined, a spatial harmonic is obtained as p(k,φ)

$$p(k,\varphi) = \sum_x \sum_y w(x,y) \sum_2 \frac{e^{jkr_0\cos(\varphi - 2\theta_0)}}{F(k\cos\varphi, k\sin\varphi)} f(x - r_o\cos 2\theta_0, y - r_0\sin 2\theta_0) \quad \text{Equation (4)}$$

Equation (4)

As another instance, using m=3, which means that when three partial radial backprojection signals detected by three detectors, for instance, detectors 202, 204, and 208, are combined, another spatial harmonic is obtained as p(k,φ)

$$p(k,\varphi) = \sum_x \sum_y w(x,y) \sum_3 \frac{e^{jkr_0\cos(\varphi - 3\theta_0)}}{F(k\cos\varphi, k\sin\varphi)} f(x - r_o\cos 3\theta_0, y - r_0\sin 3\theta_0) \quad \text{Equation (5)}$$

Equation (5)

Similarly, three additional spatial harmonics for m=1, m=4, and m=5 can be obtained for an array of five detectors.

However, the spatial harmonics are not limited to five for a given array of five detectors that detect partial gradient phase-encoded signals. For each m, additional spatial harmonics can be obtained by varying φ. For example, for m=1, a spatial harmonic is obtained as $(k,\phi_1)$ $$p(k,\varphi_1) = \sum_x \sum_y w(x,y) \sum_1 \frac{e^{jkr_0\cos(\varphi_1 - \theta_0)}}{F(k\cos\varphi_1, k\sin\varphi_1)} f(x - r_o\cos\theta_0, y - r_0\sin\theta_0) \quad \text{Equation (6)}$$

Equation (6)

As yet another example, for m=1, a spatial harmonic is obtained as p(k,φ₂)

$$p(k, \varphi_2) = \sum_x \sum_y w(x, y) \sum_1 \frac{e^{jkr_0\cos(\varphi_2 - \theta_0)}}{F(k\cos\varphi_2, k\sin\varphi_2)} f(x - r_o \cos\theta_0, y - r_0 \sin\theta_0)$$

Equation (7)

Equation (7)

Hence, there is an increase in the limit on a number of spatial harmonics that can be obtained by varying φ for each m. The limit is increased as long as one spatial harmonic is different from any other spatial harmonic. Once a full k-space matrix is obtained with each line of the k-space matrix being a spatial harmonic, an image is reconstructed using any one of Fourier transform and non-Fourier transform methods from data in the k-space matrix. The spatial harmonics that can be obtained by varying φ and varying m virtually generate additional backprojection signals. Each additional backprojection signal is either an additional partial backprojection signal or an additional complete backprojection signal. The additional partial backprojection signal has incomplete information that is used to generate a part of a portion of an image of body 130 and the complete backprojection signal has complete information that is used to generate the portion of the image of body 130.

Figure 4:
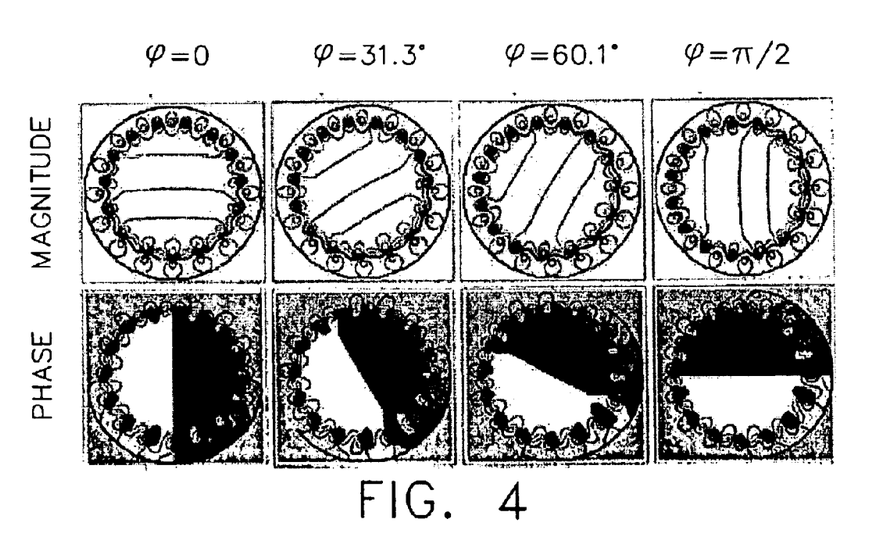
FIGS. 4, 5, and 6 illustrate experimental results obtained by implementing a radial SMASH method using the MRI system of FIG. 1.
Figure 5:
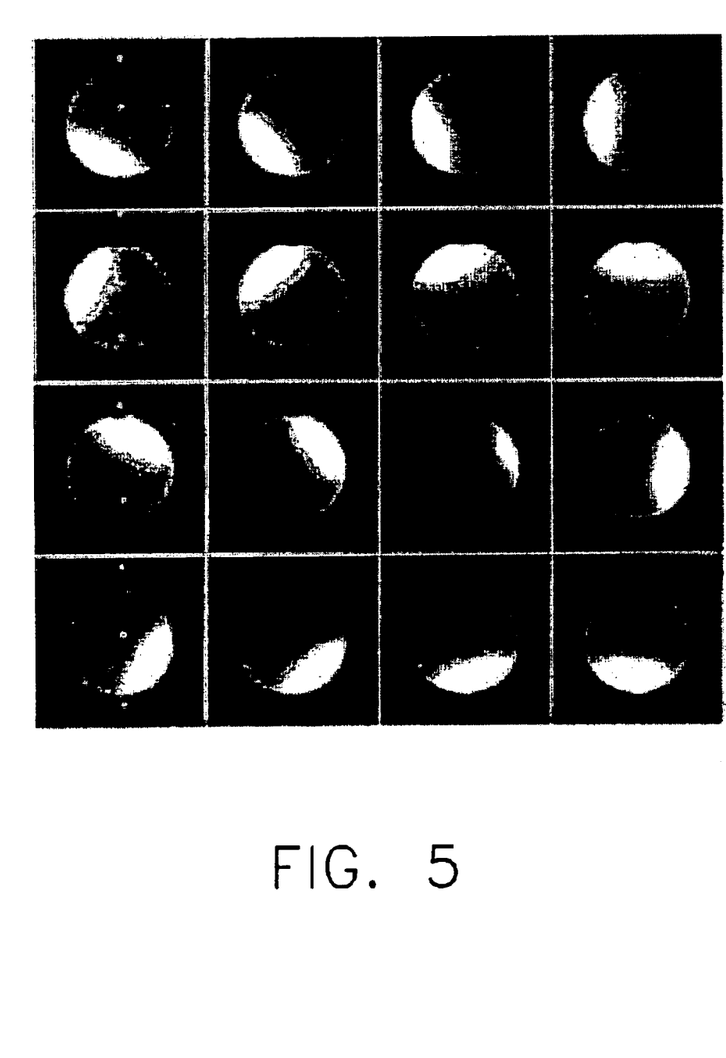
Figure 6:
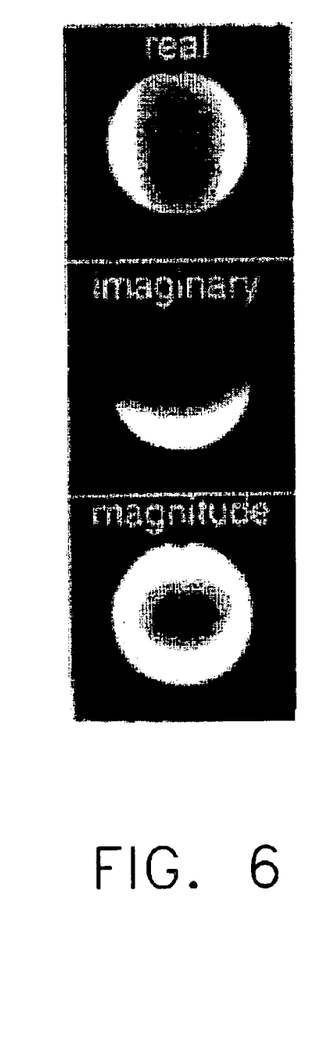

FIGS. 4, 5, and 6 illustrate experimental results that were obtained by implementing a radial SMASH method using MRI system 100. The experiment was conducted using a General Electric™ Corporation's LX scanner. FIG. 4 shows magnitudes and phases of the spatial encoding term exp. jk(x cos φ+y sin φ) for φ=0 degrees, for approximately 30 degrees, such as, for instance, 31.3 degrees, for approximately 60 degrees, such as, for instance, 60.1 degrees and for 90 degrees. The magnitudes and phases were obtained with the radial SMASH system with m=16 detectors, $r_o$=12.6 centimeters (cm), radius of a shield=15.2 cm, image current radius=18.3 cm, $\theta_o$=22.5 degrees, and k=π/2$r_o$. FIG. 5 shows sensitivity profiles for each of the 16 detectors and FIG. 6 shows a real component, an imaginary component, and a magnitude of the composite sensitivity profile exp. jk(x cos φ+y sin φ) that is obtained by summing the sensitivity profiles of the detectors. The real component and the imaginary component demonstrates a 2-dimensional sinusoidal behavior in a half wavelength. The magnitude of the composite sensitivity is not flat but is low in the middle, which means that the composite sensitivity is a natural highpass filter used for performing filtered backprojection to reconstruct an image.

Using the herein described radial SMASH systems and methods, partial gradient phase-encoded signals are simultaneously acquired to create an image of a slice of body 130 being scanned. Consequently, time taken to create a complete image of body 130 is significantly reduced as compared to MRI systems that embody serial encoding techniques or methods. In addition, unlike Cartesian SMASH, where a number of spatial harmonics cannot exceed a number of detectors that detect partial gradient phase-encoded signals, there is no limit on a number of spatial harmonics that are obtained by using the herein described radial SMASH systems and methods. It is noted that the Equations (1)–(7) are stored in memory 114 and controller 106 retrieves any of the equations when necessary for a computation.

While the invention has been described in terms of various specified embodiments, those skilled in the art will recognize that the invention can be practiced with modification within the spirit and scope of the claims.

What is claimed is:

1. A magnetic resonance imaging (MRI) method comprising:

simultaneously acquiring partial radial backprojection signals from a cylindrical array of m detectors surrounding an object;

generating, in a k-space, additional backprojection signals with decimated b-fold backprojection steps, wherein generating includes producing 2-dimensional (2D) spatial harmonics to replace the decimated b-fold backprojection steps, and wherein producing includes assuming that a sum of weighted sensitivity profiles of at least one of the detectors is a function of an angle between a vector k and an axis $k_x$ of the k-space and a function of a radius of a cylindrical surface formed by the array of detectors, the angle being an angle along which reconstruction of an image of the object is performed.

2. An MRI method in accordance with claim 1 wherein assuming comprises assuming that the sum of weighted sensitivity profiles of at least one of the detectors is the function of the angle between the vector k and the $k_x$ axis of the k-space, the function of the radius of the cylindrical surface formed by the array of detectors, and a function of an angle between two adjacent detectors in the array.

3. An MRI method in accordance with claim 1 wherein assuming comprises assuming that the sum is provided by $$e^{jk(x\cos\varphi + y\sin\varphi)} = \sum_m C(m, k, \varphi) f(x - r_0\cos m\theta_0, y - r_0\sin m\theta_0),$$

φ being the angle between the vector k and the $k_x$ axis of the k-space, x and y being spatial co-ordinates of an image domain, $r_o$ being the radius of a cylindrical surface formed by the array of detectors, and $\theta_o$ being an angle between two adjacent detectors in the array.

4. An MRI method in accordance with claim 3 wherein generating comprises calculating a weighted coefficient of any of the detectors, and wherein calculating the weighted coefficient includes calculating a weighted coefficient of an $m^{th}$ detector of the array by using $$C(m, k, \varphi) = \frac{e^{jkr_0\cos(\varphi - m\theta_0)}}{F(k\cos\varphi, k\sin\varphi)},$$

C(m,k,φ) being the weighted coefficient of the $m^{th}$ detector, $F(k_x, k_y)$ being a Fourier transform of f(x,y), $k_x$ being equal to k cos φ, and $k_y$ being equal to k sin φ.

5. An MRI method in accordance with claim 1 wherein generating comprises generating at least one of additional partial backprojection signals and additional complete backprojection signals.

6. An MRI method in accordance with claim 1 further comprising:

combining the spatial harmonics to form at least one set of k-space data; and reconstructing the image from the set of k-space data.

7. An MRI method in accordance with claim 1 wherein simultaneously acquiring comprises simultaneously acquiring the partial radial backprojection signals from a cylindrical array of equally spaced m detectors surrounding the object.

8. A system comprising:

a signal detection device having a cylindrical array of m detectors surrounding an object and configured to simultaneously acquire partial radial backprojection signals from the cylindrical array; and a controller electrically connected to the signal detection device, the controller configured to generate, in a k-space, additional backprojection signals with decimated b-fold backprojection steps, wherein to generate the additional backprojection signals the controller configured to produce 2-dimensional (2D) spatial harmonics to replace the decimated b-fold backprojection steps, and wherein to produce the 2D spatial harmonics the controller configured to retrieve from a memory a sum of weighted sensitivity profiles of at least one of the detectors that is a function of an angle between a vector k and an axis $k_x$ of the k-space and a function of a radius of a cylindrical surface formed by the array of detectors, the angle being an angle along which reconstruction of an image of the object is performed.

9. A system in accordance with claim 8 wherein to retrieve from the memory the controller configured to obtain the sum of weighted sensitivity profiles of at least one of the detectors, the sum being the function of the angle between the vector k and the $k_x$ axis of the k-space, the function of the radius of the cylindrical surface formed by the array of detectors, and a function of an angle between two adjacent detectors in the array.

10. A system in accordance with claim 8 wherein to retrieve from the memory the controller configured to obtain the sum that is provided by $$e^{jk(x\cos\varphi + y\sin\varphi)} = \sum_m C(m, k, \varphi) f(x - r_0 \cos m\theta_0, y - r_0 \sin m\theta_0),$$

$\varphi$ being the angle between the vector k and the $k_x$ axis of the k-space, x and y being spatial co-ordinates of an image domain, $r_o$ being the radius of a cylindrical surface formed by the array of detectors, and $\theta_o$ being an angle between two adjacent detectors in the array.

11. A system in accordance with claim 10 wherein to produce the spatial harmonics the controller configured to calculate a weighted coefficient of any of the detectors, and wherein to calculate the weighted coefficient the controller configured to calculate a weighted coefficient of an $m^{th}$ detector of the array using $$C(m, k, \varphi) = \frac{e^{jkr_0\cos(\varphi - m\theta_0)}}{F(k\cos\varphi, k\sin\varphi)},$$

$C(m,k,\varphi)$ being the weighted coefficient of the $m^{th}$ detector, $F(k_x, k_y)$ being a Fourier transform of $f(x,y)$, $k_x$ being equal to $k\cos\varphi$, and $k_y$ being equal to $k\sin\varphi$.

12. A system in accordance with claim 8 wherein to generate additional backprojection signals the controller configured to generate at least one of additional partial backprojection signals and additional complete backprojection signals.

13. A system in accordance with claim 8 wherein the controller is configured to:

combine the spatial harmonics to form at least one set of k-space data; and reconstruct the image from the set of k-space data.

14. A system in accordance with claim 8 wherein the detection device is configured to acquire at the same time partial radial backprojection signals from a cylindrical array of equally spaced m detectors surrounding the object.

15. A magnetic resonance imaging (MRI) system comprising:

a magnetic resonance (MR) signal detection device having an array of m detectors surrounding an object and configured to simultaneously acquire partial radial backprojection signals from the cylindrical array; and a controller electrically connected to the MR signal detection device, the controller configured to generate, in a k-space, additional backprojection signals with decimated b-fold backprojection steps, wherein to generate the additional backprojection signals the controller configured to produce 2-dimensional (2D) spatial harmonics to replace the decimated b-fold backprojection steps, and wherein to produce the 2D spatial harmonics the controller configured to retrieve from a memory a sum of weighted sensitivity profiles of at least one of the detectors that is a function of an angle between a vector k and an axis $k_x$ of the k-space and a function of a radius of a cylindrical surface formed by the array of detectors, the angle being an angle along which reconstruction of an image of the object is performed.

16. An MRI system in accordance with claim 15 wherein to retrieve from the memory the controller configured to obtain the sum of weighted sensitivity profiles of at least one of the detectors, the sum being the function of the angle between the vector k and the $k_x$ axis of the k-space, the function of the radius of the cylindrical surface formed by the array of detectors, and a function of an angle between two adjacent detectors in the array.

17. An MRI system in accordance with claim 15 wherein to retrieve from the memory the controller configured to obtain the sum that is provided by $$e^{jk(x\cos\varphi + y\sin\varphi)} = \sum_m C(m, k, \varphi) f(x - r_0 \cos m\theta_0, y - r_0 \sin m\theta_0),$$

$\varphi$ being the angle between the vector k and the $k_x$ axis of the k-space, x and y being spatial co-ordinates of an image domain, $r_o$ being the radius of a cylindrical surface formed by the array of detectors, and $\theta_o$ being an angle between two adjacent detectors in the array.

18. An MRI system in accordance with claim 17 wherein to produce the spatial harmonics the controller configured to calculate a weighted coefficient of any of the detectors, and wherein to calculate the weighted coefficient the controller configured to calculate a weighted coefficient of an $m^{th}$ detector of the array using $$C(m, k, \varphi) = \frac{e^{jkr_0\cos(\varphi - m\theta_0)}}{F(k\cos\varphi, k\sin\varphi)},$$

$C(m,k,\varphi)$ being the weighted coefficient of the $m^{th}$ detector, $F(k_x, k_y)$ being a Fourier transform of $f(x,y)$, $k_x$ being equal to $k\cos\varphi$, and $k_y$ being equal to $k\sin\varphi$.

19. An MRI system in accordance with claim 15 wherein to generate additional backprojection signals the controller configured to generate at least one of additional partial backprojection signals and additional complete backprojection signals.

20. An MRI system in accordance with claim 15 wherein each of the m detectors are equally spaced.

* * * * *